United States Patent
Blizzard et al.

(10) Patent No.: US 8,405,233 B2
(45) Date of Patent: Mar. 26, 2013

(54) FLEXIBLE BARRIER FILM, METHOD OF FORMING SAME, AND ORGANIC ELECTRONIC DEVICE INCLUDING SAME

(75) Inventors: John Blizzard, Bay City, MI (US); James Steven Tonge, Sanford, MI (US); William Kenneth Weidner, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 13/144,362

(22) PCT Filed: Jan. 13, 2010

(86) PCT No.: PCT/US2010/020923
§ 371 (c)(1),
(2), (4) Date: Jul. 13, 2011

(87) PCT Pub. No.: WO2010/083236
PCT Pub. Date: Jul. 22, 2010

(65) Prior Publication Data
US 2011/0272682 A1  Nov. 10, 2011

Related U.S. Application Data

(60) Provisional application No. 61/144,517, filed on Jan. 14, 2009.

(51) Int. Cl.
*H01L 23/29* (2006.01)
(52) U.S. Cl. . 257/788; 257/789; 257/790; 257/E23.117; 257/E23.126
(58) Field of Classification Search ......... 257/788, 257/789, 790, E23.117, E23.126
See application file for complete search history.

(56) References Cited

U.S. PATENT DOCUMENTS

| | | | |
|---|---|---|---|
| 5,648,173 A | 7/1997 | Blizzard | |
| 5,840,428 A | 11/1998 | Blizzard et al. | |
| 6,896,979 B2 | 5/2005 | Sawai et al. | |
| 7,811,640 B2 * | 10/2010 | Charters et al. | 427/558 |
| 2004/0147120 A1 * | 7/2004 | Rogalli et al. | 438/689 |
| 2007/0224368 A1 | 9/2007 | Hara et al. | |
| 2008/0305350 A1 | 12/2008 | Agata | |
| 2009/0286340 A1 * | 11/2009 | Kaneko et al. | 438/30 |

FOREIGN PATENT DOCUMENTS

| | | |
|---|---|---|
| EP | 1045009 A1 | 10/2000 |
| GB | 2367556 A | 4/2002 |
| JP | 07018221 | 1/1995 |
| WO | WO 2010083242 A1 | 7/2010 |

OTHER PUBLICATIONS

English language abstract for JP 07018221 extracted from Database WPI Week 199513 Thomson Scientific, London, GB; AN 1995-094032, 16 pages.
International Search Report for Application No. PCT/US2010/020923 dated May 4, 2010, 4 pages.
International Search Report for Application No. PCT/US2010/020933 dated Jun. 1, 2010, 4 pages.

* cited by examiner

*Primary Examiner* — Ngan Ngo
(74) *Attorney, Agent, or Firm* — Howard & Howard Attorneys PLLC

(57) ABSTRACT

A flexible barrier film has a thickness of from greater than zero to less than 5,000 nanometers and a water vapor transmission rate of no more than $1 \times 10^{-2}$ g/m²/day at 22° C. and 47% relative humidity. The flexible barrier film is formed from a composition, which comprises a multi-functional acrylate. The composition further comprises the reaction product of an alkoxy-functional organometallic compound and an alkoxy-functional organosilicon compound. A method of forming the flexible barrier film includes the steps of disposing the composition on a substrate and curing the composition to form the flexible barrier film. The flexible barrier film may be utilized in organic electronic devices.

22 Claims, 4 Drawing Sheets

FLEXIBLE BARRIER FILM, METHOD OF FORMING SAME, AND ORGANIC ELECTRONIC DEVICE INCLUDING SAME

RELATED APPLICATIONS

This application claims priority to and all the advantages of International Patent Application No. PCT/US2010/020923, filed on Jan. 13, 2010, which claims priority to U.S. Provisional Patent Application No. 61/144,517, filed on Jan. 14, 2009.

STATEMENT OF GOVERNMENT RIGHTS

This invention was made with government support under Contract No. DE-FC26-05NT42344 awarded by the Department of Energy. The government has certain rights in the invention.

FIELD OF THE INVENTION

The present invention generally relates to a flexible barrier film and a method of forming the flexible barrier film. The flexible barrier film has excellent water vapor transmission rates. The present invention also relates to an organic electronic device including the flexible barrier film.

DESCRIPTION OF THE RELATED ART

Flexible barrier films are known in the art and are utilized in many different industries and diverse applications. Typically, flexible barrier films are formed on substrates to improve physical properties of the substrates and/or to impart the substrates with aesthetic qualities. One example of an industry which utilizes flexible barrier films is the organic electronic device industry. Examples of organic electronic devices include organic light emitting diodes (OLEDs), organic electrochromic displays, organic photovoltaic devices, and organic thin film transistors.

Organic electronic devices are susceptible to degradation and/or failure due to exposure to moisture and/or oxygen. Typical organic electronic devices include an organic material disposed between two substrates and sealed between the two substrates via an ultraviolet-cured epoxy resin adhesive, which is disposed about the perimeter of the organic material. The two substrates are generally metal or glass, which are hermetic and act as a barrier to prevent moisture and/or oxygen from degrading the organic electronic devices. In addition, the two substrates prevent potentially reactive species from escaping from the organic electronic device and damaging or deteriorating other portions of the organic electronic device. For example, the organic material or the ultraviolet-cured epoxy resin adhesive may out gas and produce the potentially reactive species, which is contained within the organic electronic device by the two substrates. However, the ultraviolet-cured epoxy resin adhesive is generally non-hermetic, and moisture and/or oxygen may permeate the ultraviolet-cured epoxy resin adhesive over time and deteriorate the organic material of the organic electronic device. In addition, each of these substrates has significant drawbacks. For example, metal is opaque and both glass and metal are rigid, i.e., inflexible.

To further prevent degradation of the organic electronic device, the organic material may be coated with a desiccant, which has a high affinity for and absorbs moisture before the moisture comes into incidental contact with the organic material. However, the substrates must be altered, e.g. etched or sandblasted, such that the substrates can house the desiccant. This adds significant cost to form the organic electronic device with respect to the step of altering the two substrates for the desiccant and for the cost of the desiccant alone.

Because it is becoming more advantageous for organic electronic devices to have flexibility, one attempt to improve organic electronic devices is to encapsulate the organic material of the organic electronic device with a thin film, i.e., the flexible barrier film. The organic material encapsulated by the flexible barrier film is adhered to a flexible substrate. The flexible barrier film is advantageous over glass and metal because the flexible barrier film is both transparent and flexible. Flexibility is becoming an increasingly desirable physical property of organic electronic devices, such as OLEDs. For example, OLEDs which can be rolled and/or bent while still displaying an image are currently being developed. This is not possible if the OLEDs have the substrates that are glass. However, typical flexible barrier films have many physical properties that are undesirable as well. For example, flexible barrier films are not perfectly hermetic, and moisture and/or oxygen may slowly permeate the flexible barrier film and deteriorate the organic electronic device. This permeation is typically quantified by a high water vapor transmission rate of the flexible barrier film, which is a measure of a rate at which water passes through the flexible barrier film as a function of the temperature and humidity gradient across the flexible barrier film as well as a thickness of the flexible barrier film.

In addition, flexible barrier films often have an undesirable hardness such that the flexible barrier films are easily scratched and/or abraded. Once the flexible barrier films become scratched and/or abraded, the flexible barrier films are more susceptible to degradation and deterioration. Further, flexible barrier films typically have poor adhesion to the flexible substrate. When the flexible barrier films have poor adhesion to the flexible substrate, the organic electronic device is also more susceptible to degradation.

One attempt to ameliorate the undesirable high water vapor transmission rate of flexible barrier films is to form a multilayered film. The multilayered film generally includes alternating organic layers and inorganic layers. To form the multilayered film, an organic composition, such as a polymeric composition, is applied on a substrate and cured to form an organic layer. Then, an inorganic composition, such as aluminum oxide, is deposited on the organic layer to form an inorganic layer. The organic composition is then applied on the inorganic layer and cured to form a second organic layer. These steps are performed continuously until the multilayered film is formed, which can include up to and even in excess of twelve distinct layers. However, the method of forming such a multilayer film is extremely time intensive because each organic composition must be cured prior to depositing each inorganic composition on each respective organic layer. In addition, because the multilayered film is formed continuously, the method is expensive with respect to equipment necessary to form the mutlilayered film.

There have also been attempts to reduce the number of layers required in the multilayered film while the multilayered film maintains an excellent water vapor transmission rate. These attempts involve forming the multilayered film from different types of compositions. However, these multilayered films typically have a desirable flexibility and planarizing properties but poor water vapor transmission values, or adesirable water vapor transmission values but poor flexibility and planarizing properties. Therefore, these compositions have not been optimized such that the multilayered films formed therefrom have excellent water vapor transmission values, flexibility, and planarizing properties.

In view the foregoing, it would be advantageous to provide an improved flexible barrier film having an excellent water vapor transmission rate and addressing the deficiencies set forth above. It would be further advantageous to provide a method of forming the improved flexible barrier film.

SUMMARY OF THE INVENTION AND ADVANTAGES

The present invention provides a flexible barrier film. The flexible barrier film has a thickness of from greater than zero to less than 5,000 nanometers and a water vapor transmission rate of no more than $1 \times 10^{-2}$ g/m²/day at 22° C. and 47% relative humidity. The flexible barrier film is formed from a composition which comprises a multi-functional acrylate. The composition further comprises the reaction product of an alkoxy-functional organometallic compound and an alkoxy-functional organosilicon compound. The alkoxy-functional organometallic compound has the general chemical formula:

wherein M is selected from a silicon atom, a zirconium atom and a titanium atom, and each OR is an independently selected alkoxy group. The alkoxy-functional organosilicon compound has the general chemical formula:

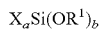

wherein each X is an independently selected monovalent organic radical; each $OR^1$ is an independently selected alkoxy group; a is 1, 2, or 3; b is 1, 2, or 3; and a+b=4. The reaction product of the composition also comprises water in an amount sufficient to ensure said reaction product (B) does not gel and a precipitate does not form therefrom.

The present invention also provides a method of forming the flexible barrier film. The method comprises the step of disposing the composition on the substrate. The method further comprises the step of curing the composition on the substrate to form the flexible barrier film.

The present invention also provides an organic electronic device. The organic electronic device comprises a support layer. The organic electronic device further comprises an organic electronic material disposed on the support layer. The organic electronic device also comprises an adhesive layer disposed on the organic electronic material. The flexible barrier film is disposed on the adhesive layer such that the organic electronic material is encapsulated by the support layer, the adhesive layer, and the flexible barrier film.

The flexible barrier film of the present invention has excellent water vapor transmission rates. In addition, due to the improved composition from which the flexible barrier film of the present invention is formed, the flexible barrier film also has excellent planarizing properties, adhesion, and flexibility. The organic electronic device, which includes the flexible barrier film, has excellent longevity and resistance to degradation due to the excellent water vapor transmission rates of the flexible barrier film.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

Figure 1:
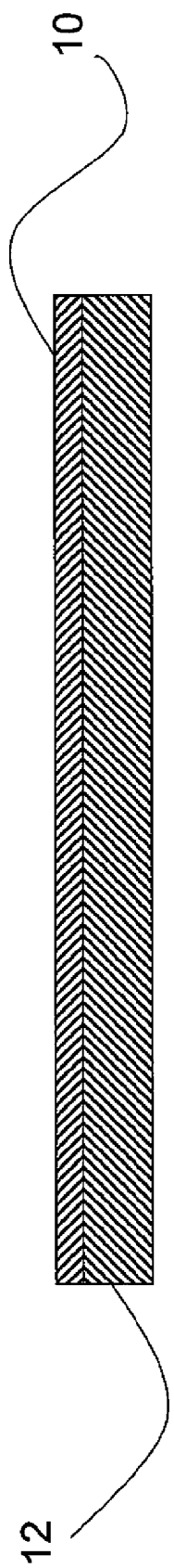
FIG. 1 is a schematic cross-sectional view of a flexible barrier film disposed on a substrate.

Referring to the Figures, wherein like numerals indicate corresponding parts throughout the several views, a flexible barrier film 10 is generally shown. The present invention provides the flexible barrier film 10 and a method of forming the flexible barrier film 10 from a composition. The flexible barrier film 10 of the present invention has excellent water vapor transmission rates and excellent planarizing properties. The present invention also provides an organic electronic device 16 including the flexible barrier film 10. The organic electronic device 16 may be any organic electronic device 16 which includes the flexible barrier film 10 of the present invention. For example, the organic electronic device 16 may be an organic light emitting diode device, an organic electrochromic display device, an organic photovoltaic device, and/or an organic thin film transistor device. However, it is to be appreciated that the flexible barrier film 10 of the present invention may be used in applications other than organic electronic devices. For example, the flexible barrier film 10 of the present invention may be utilized in food preservation applications because water vapor and/or oxygen cannot easily permeate the flexible barrier film 10 due to the excellent water vapor transmission rates of the flexible barrier film 10.

As set forth above, the flexible barrier film 10 of the present invention is formed from a composition. The composition comprises a multi-functional acrylate. Typically, the multi-functional acrylate is an aliphatic urethane acrylate, such as aliphatic urethane diacrylate. The multi-functional acrylate is typically what is referred to in the art as a "pre-polymer." Pre-polymers are typically oligomers which are formed by reacting two or more components such that the pre-polymers have excess functional groups which remain unreacted in the pre-polymers. It is to be appreciated that the multi-functional acrylate may be a monomer or may be a polymer. In addition, the multi-functional acrylate may comprise a blend of different types of multi-functional acrylates. The blend of multi-functional acrylates may comprise any combination of multi-functional acrylates which are monomeric, oligomeric, and/or polymeric. When the multi-functional acrylate is the aliphatic urethane acrylate, the aliphatic urethane acrylate is typically formed by reacting an isocyanate and a polyol such that the aliphatic urethane acrylate formed therefrom has at least two functional groups selected from acryloxy functional groups, methacryloxy functional groups, and combinations thereof. At least one of the isocyanate and the polyol has at least one acryloxy functional group and/or methacryloxy functional group, which remains in the aliphatic urethane acrylate formed from reacting the isocyanate and the polyol. As designated by the term "aliphatic," the aliphatic urethane acrylate is free from aromatic groups. An example of a multi-functional acrylate suitable for the purposes of the present invention is Ebecryl® 230, commercially available from Cytec Industries, Inc. of West Paterson, N.J. Another example of a multi-functional acrylate suitable for the purposes of the present invention is pentaerythritol tetraacrylate. The multi-functional acrylate is typically present in the composition in an amount of from 40 to 97, more typically from 48.5 to 93, most typically from 57 to 89, percent by weight based on the total weight of the composition.

The composition further comprises the reaction product of an alkoxy-functional organometallic compound and an alkoxy-functional organosilicon compound, each of which are described in greater detail below, respectively. The reaction product is typically present in the composition in an amount of from 3 to 60, more typically from 7 to 54, most typically 11 to 48, percent by weight based on the total weight of the composition.

The alkoxy-functional organometallic compound has the general chemical formula:

wherein M is selected from a silicon atom, a zirconium atom and a titanium atom, and each OR is an independently selected alkoxy group. It is to be appreciated that the alkoxy-functional organometallic compound may comprise a blend of different types of alkoxy-functional organometallic compounds, which may include those based on silicon, titanium, and combinations thereof. Typically, each of the alkoxy groups of the alkoxy-functional organometallic compound has from 1 to 4 carbon atoms. When the M of the alkoxy-functional organometallic compound is silicon, a specific example of the alkoxy-functional organometallic compound suitable for the purposes of the present invention is a tetraalkoxysilane. One example of a tetraalkoxysilane having from 1 to 4 carbon atoms in each of the alkoxy groups is tetraethoxysilane, which is depicted below in Formula 1 for illustrative purposes only.

Formula 1

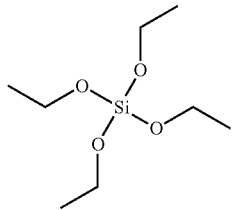

When the M of the alkoxy-functional organometallic compound is titanium, a specific example of the alkoxy-functional organometallic compound suitable for the purposes of the present invention is a tetraalkyltitanate. One example of a tetraalkyltitanate having from 1 to 4 carbon atoms in each of the alkoxy groups is tetrabutyltitanate, which is depicted below in Formula 2 for illustrative purposes only.

Formula 2

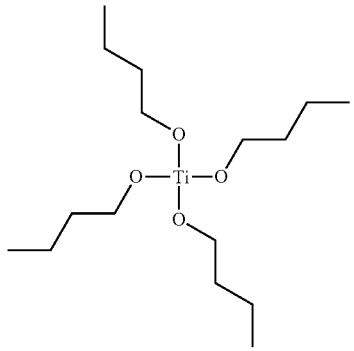

The alkoxy-functional organosilicon compound has the general chemical formula:

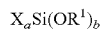

wherein each X is an independently selected monovalent organic radical; each $OR^1$ is an independently selected alkoxy group; a is 1, 2, or 3; b is 1, 2, or 3; and a+b=4. In other words, the alkoxy-functional organosilicon compound has at least one monovalent organic radical and at least one alkoxy group. As set forth by the formula "a+b=4," the alkoxy-functional organosilicon compound may comprise one monovalent organic radical and three alkoxy groups, two monovalent organic radicals and two alkoxy groups, or three monovalent organic radicals and one alkoxy group. Generally, each of the alkoxy groups has from 1 to 4 carbon atoms.

Typically, at least one of the monovalent organic radicals of the alkoxy-functional organosilicon compound comprises at least one ethylenically unsaturated group, i.e., a C=C group. Each of the monovalent organic radicals of the alkoxy-functional organosilicon compound is typically independently selected from the group of vinyl radicals, hexenyl radicals, methacryloxy radicals, acryloxy radicals, styryl radicals, vinyl ether radicals, and combinations thereof. Specific examples of the alkoxy-functional organosilicon compound which include at least one of the monovalent organic radicals set forth above include, but are not limited to, vinyltrimethoxy silane, vinyltriethoxy silane, and vinyldimethoxymethyl silane, each of which is commercially available from PCR, Inc, of Gainesville, Fla. Other examples of alkoxy-functional organosilicon compounds including at least one of the monovalent organic radicals set forth above is methacryloxypropyltrimethoxysilane and glycidoxypropyltrimethoxysilane, commercially available from Dow Corning Corporation of Midland, Mich.

Alternatively to the monovalent organic radicals set forth above, at least one of the monovalent organic radicals of the alkoxy-functional organosilicon compound may comprise what is referred to in the art as a Michael adduct. In this embodiment, the alkoxy-functional organosilicon compound is formed from a Michael addition reaction between an amino-functional alkoxy organosilicon compound and a multi-functional acrylate, which may be the same as or different from the multi-functional acrylate described above. Examples of amino-functional alkoxy organosilicon compounds suitable for the purposes of the present invention include, but are not limited to, 3-aminopropyltriethoxysilane, 3-aminopropyltrimethoxysilane, 3 aminopropylmethyldimethoxysilane; and n-(2-aminoethyl)-3 aminopropyltrimethoxysilane. Amino-functional alkoxy organosilicon compounds are commercially available Dow Corning Corp. of Midland, Mich.

The reaction product of the composition is formed from reacting the alkoxy-functional organo silicon compound with the alkoxy-functional organometallic compound. The reaction between the alkoxy-functional organosilicon compound and the alkoxy-functional organometallic compound is a co-condensation and co-hydrolysis reaction, as described in greater detail below.

Typically, the reaction product is formed in the presence of water in an amount sufficient to ensure that the reaction product does not gel and a precipitate does not form therefrom. The alkoxy groups of the alkoxy-functional organometallic compound and the alkoxy-functional organosilicon compound undergo a hydrolysis reaction in the presence of water. In the hydrolysis reaction, water and each alkoxy group react to form a hydroxyl radical (OH) and an alcohol (ROH). Thus, one mole of water reacts with one mole of alkoxy groups, which forms one mole of hydroxyl radicals.

It is known in the art that particular alkoxy groups are more amenable to the hydrolysis reaction than other alkoxy groups and, thus, the hydrolysis reaction generally reaches equilibrium prior to all of the alkoxy groups of the alkoxy-functional organometallic compound and the alkoxy-functional organosilicon compound reacting with water. In addition, without intending to be limited by theory, it is believed that if too much water is present when forming the reaction product, a resin network nuclei formed from the hydrolysis reaction is sufficiently large such that the resin network nuclei precipitates, or the resin network nuclei becomes sufficiently large to initiate a condensation reaction, which results in the gel. If either the gel or the precipitate is formed, the physical properties of the flexible barrier film 10 formed from the composition are typically undesirable.

In the condensation reaction, two hydroxyl radicals react to form a single molecule of water and also establish a cross-linking oxygen bond. The water formed from the condensation reaction then contributes to the hydrolysis reaction described above, such that the condensation reaction and the hydrolysis reaction occur contemporaneously. Because the hydrolysis reaction and the condensation reaction occur simultaneously, equilibrium of the reaction product of the composition is dependent upon each respective reaction. In a manner analogous to the hydrolysis of the alkoxy groups, particular hydroxyl radicals are more amenable to the condensation reaction than other hydroxyl radicals. Thus, the condensation reaction generally reaches an equilibrium prior to all of the hydroxyl radicals undergoing the condensation reaction. It is to be appreciated that the hydrolysis reaction requires two molecules of water to hydrolyze two alkoxy groups and that the condensation reaction between two hydroxyl radicals forms one water molecule. Therefore, the water will eventually be consumed by the hydrolysis reaction unless the water is present in an amount which exceeds that which is required to hydrolyze all of the alkoxy groups. As such, the amount of water present during the hydrolysis reaction and the condensation reaction determines the degree of cross-linking which occurs between the alkoxy-functional organometallic compound and the alkoxy-functional organosilicon compound.

In certain embodiments of the present invention, the reaction product is formed in the presence of a siloxane polymerization catalyst. Siloxane polymerization catalysts are well known in the art for increasing the degree of cross-linking which occurs in the hydrolysis reaction and the condensation reaction between alkoxy-functional organometallic compounds and alkoxy-functional organosilicon compounds. The siloxane polymerization catalyst is typically selected from the group of sulfuric acid, perchloric acid, trifluoromethane sulfonic acid, acrylic acid, potassium hydroxide, sodium hydroxide, amines, and combinations thereof.

Although the order of addition is not crucial to the present invention, typically, the alkoxy-functional organometallic compound and the alkoxy-functional organosilicon compound are combined with the multi-functional acrylate to form a mixture. Thereafter, the siloxane polymerization catalyst and the water are added to the mixture. In this embodiment, the reaction product of the composition forms in the presence of the multi-functional acrylate of the composition.

In certain embodiments of the present invention, the composition further comprises an initiating agent. The initiating agent may be any initiating agent known in the art. In certain embodiments, the initiating agent comprises a photoinitiating agent. Photoinitiating agents are known in the art and undergo a photoreaction upon the absorption of light, which is typically in the ultraviolet spectrum, i.e., from 300 to 400 nm. The photoreaction generally forms reactive species, which may initiate or catalyze further chemical reactions. Typically, the photoinitiates a polymerization or polycondensation reaction. Therefore, when the composition of the present invention includes the photoinitiating agent, the flexible barrier film 10 may be formed from the composition by applying ultraviolet radiation to the composition, as described in greater detail below.

It is to be appreciated that the composition which forms the flexible barrier film 10 may further comprise other components and/or compounds not specifically recited herein. For example, the composition may further comprise group I or group II metals, silica, aluminosilicates, and the like for scavenging water vapor and increasing the water vapor transmission value of the flexible barrier film 10 formed from the composition, which is described in greater detail below. In addition, the composition may further comprise dyes and/or fillers to enhance and/or modify physical properties of the flexible barrier film 10 formed from the composition. Further, the composition may also comprise a condensation catalyst and/or an autopolymerization inhibitor.

Figure 2:
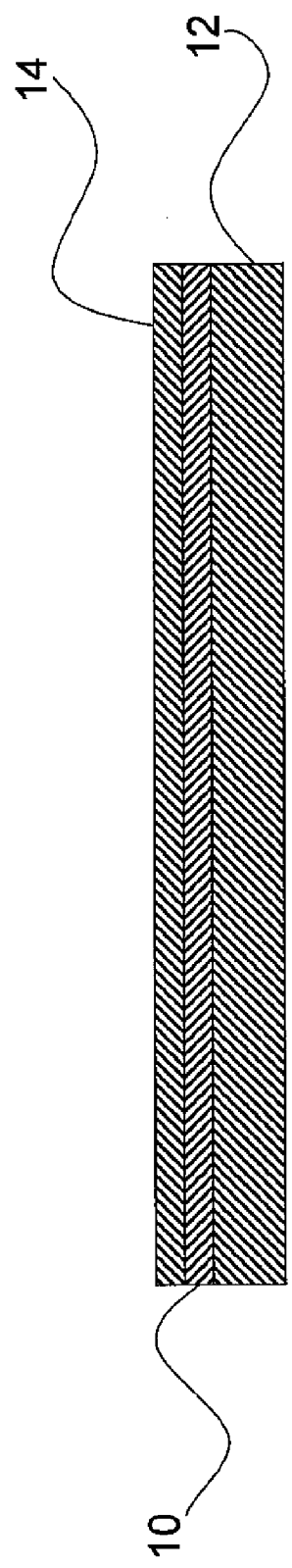
FIG. 2 is a schematic cross-sectional view of the flexible barrier film disposed on the substrate including an inorganic layer disposed on the flexible barrier film.

In certain embodiments, the flexible barrier film 10 further comprises an inorganic layer 14 formed from an inorganic composition and disposed on the flexible barrier film 10. FIG. 2 illustrates the flexible barrier film 10 disposed on the substrate 12 and having the inorganic layer 14 disposed thereon. Typically, the inorganic composition comprises a metal oxide, a metal carbide, a metal nitride, or combinations thereof. For example, the inorganic composition may be silicon-based, such as SiO, SiC, SiN, SiOC, SiON, and/or SiOCN. Another example of the inorganic composition includes, but is not limited to, $Al_2O_3$. It is to be appreciated that although the inorganic composition may comprise a carbon-containing compound, these compositions are still generally referred to as inorganic compositions in the art. Generally, the inorganic layer 20 may also be referred to as a ceramic layer in the art. When utilized, the inorganic layer 14 typically has a thickness of from greater than zero to 5,000, more typically from 20 to 2,000, most typically from 50 to 500, nm.

As set forth above, the present invention also provides a method of forming the flexible barrier film 10 from the composition. The method includes the step of disposing the composition on a substrate 12 and the step of curing the composition on the substrate 12 to form the flexible barrier film 10, each of which is described in greater detail below.

The composition may be disposed on the substrate 12 in any manner known in the art. For example, the composition may be disposed on the substrate 12 by chemical deposition, plasma enhanced deposition, and the like. Alternatively, the composition may be disposed on the substrate by spin coating, printing, snowing, spray coating, and the like. In addition, the composition may be disposed on the substrate 12 via a roll application, such as a gravure roll application.

In certain embodiments of the present invention, the substrate 12 is a polymer substrate. In many applications utilizing the flexible barrier film 10 of the present invention, such as the organic electronic device 16, it is desirable that the flexible barrier film 10 and the substrate 12 are flexible. Therefore, the substrate 12 typically has a thickness of from greater than zero to 20, more typically from 1 to 10, most typically from 4 to 8, mils. Examples of the polymeric substrate suitable for the purposes of the present invention include, but are not limited to, polyesters, polyethersulphones, polyimides, fluorocarbons, and combinations thereof. A particular example of a polyester suitable for the purposes of the present invention is polyethylene terephthalate, which is commercially available from many different suppliers. A particular example of a fluorocarbon suitable for the purposes of the present invention is ethylene-tetrafluoroethylene, which is commercially available from DuPont Polymers, Specialty Polymer Division, of Wilmington, Del. FIG. 1 illustrates the flexible barrier film 10 of the present invention disposed on the substrate 12.

The method also includes the step of curing the composition on the substrate 12 to form the flexible barrier film 10. The composition may be cured in any manner known in the art. In certain embodiments, when the composition comprises the photoinitiating agent, the step of curing the composition comprises applying ultraviolet radiation to the composition. Curing the composition by applying ultraviolet radiation to the composition is particularly advantageous when the flexible barrier film 10 is utilized in the organic electronic device 16. For example, applying ultraviolet radiation to the composition does not require heat, which is commonly utilized to cure compositions. Heat can have adverse effects on the organic electronic device 16, such as thermal degradation, and such adverse effects do not exist when the step of curing the composition comprises applying ultraviolet radiation to the composition.

As described in greater detail below, when the flexible barrier film 10 is utilized in the organic electronic device 16, the composition is typically cured after the substrate 12 including the composition is applied on the organic electronic device 16. Therefore, when the step of curing the composition comprises applying ultraviolet radiation to the composition, the ultraviolet radiation must be able to at least partially penetrate at least one layer of the organic electronic device 16. Because at least one layer of the organic electronic device 16 is generally opaque, as described in greater detail below, the ultraviolet radiation typically penetrates through the substrate 12 and cures the composition. However, when the substrate 12 comprises polyethylene terephthalate, the substrate 12 typically does not allow ultraviolet radiation having a wavelength less than 320 nm to penetrate through the substrate 12. Further, only about 50% of the ultraviolet radiation having a wavelength greater than 380 nm penetrates the substrate 12. As such, when the substrate 12 comprises the polyethylene terephthalate and the composition comprises the photoinitiating agent, the step of curing the composition typically comprises applying ultraviolet radiation having a wavelength of from 320 to 440, more typically from 330 to 420, most typically from 340 to 400, nm to the composition. The ultraviolet radiation typically has an energy of from 500 to 8,000, more typically from 750 to 4,000, most typically from 1,000 to 2,000 mJ/cm$^2$. The ultraviolet radiation is typically applied to the composition for a time of from 0.1 to 40, more typically from 0.1 to 20, most typically from 0.25 to 5, second.

Once cured, the flexible barrier film 10 typically has a thickness of from greater than zero to 5,000, more typically from 20 to 2,000, most typically from 50 to 500, nm.

When the flexible barrier film 10 further comprises the inorganic layer 14, the method further comprises the step of disposing the inorganic composition on the flexible barrier film 10 to form the inorganic layer 14 on the flexible barrier film 10. Typically, the step of disposing the inorganic composition on the flexible barrier film 10 comprises plasma chemical vapor depositing the inorganic composition on the flexible barrier film 10. However, it is to be appreciated that the inorganic composition may be disposed on the flexible barrier film 10 via other methods including, but not limited to, chemical vapor deposition, plasma physical vapor deposition, and evaporation. As set forth above, when utilized, the inorganic layer 14 typically has a thickness of from greater than zero to 5,000, more typically from 1 to 1,000, most typically from 50 to 500, nm.

The flexible barrier film 10 of the present invention has excellent planarizing properties. The term "planarizing," as known in the art, describes surface properties of the flexible barrier film 10. For example, when the composition is cured to form the flexible barrier film 10 on the substrate 12, the flexible barrier film 10 does not replicate surface irregularities that may exist throughout the substrate 12. In other words, the flexible barrier film 10 has a smooth, planar surface even when the substrate 12 has the surface irregularities. The excellent planarizing properties are advantageous for many reasons. For example, when the flexible barrier film 10 is included in the organic electronic device 16, it is desirable that the flexible barrier film 10 is in continuous contact with the organic electronic device 16 to prevent water vapor and/or oxygen from degrading the organic electronic device 16. This is best achieved when the flexible barrier film 10 has the excellent planarizing properties because the flexible barrier film 10 is free from the surface irregularities, or peaks and valleys. In addition, the flexible barrier film 10 has excellent flexibility. The flexible barrier film 10 may be flexed and/or bent without cracking and/or otherwise breaking. In addition, flexing and/or bending the flexible barrier film 10 does not have adverse effects on other physical properties of the flexible barrier film 10, such as the planarizing properties or the water vapor transmission values.

The flexible barrier film 10 of the present invention has excellent water vapor transmission rates, which is a measure of a rate at which water passes through the flexible barrier film 10 as a function of the temperature and humidity gradient across the flexible barrier film 10. The flexible barrier film 10 has the excellent water vapor transmission rates even when the flexible barrier film 10 has a thickness of less than 500 nm. This is particularly advantageous when the flexible barrier film 10 of the present invention is included in the organic electronic device 16, because water vapor and/or oxygen can degrade the organic electronic device 16 if the water vapor and/or oxygen permeates the flexible barrier film 10. The flexible barrier film 10 of the present invention typically has a water vapor transmission rate of no more than $1\times10^{-2}$, more typically no more than $1\times10^{-3}$ g/m$^2$/day at 22° C. and 47% relative humidity, as measured according to the calcium degradation test, which is described below.

Typically, to measure water vapor transmission rates, ASTM E-398 is utilized. However, when the flexible barrier film 10 is utilized in the organic electronic device 16, the water vapor and/or oxygen typically permeate the organic electronic device 16 at a side ingress of the organic electronic device 16. Therefore, to properly measure the water vapor transmission rate for the side ingress, the calcium degradation test was designed and is commonly used in the industry. To determine the water vapor transmission rate via the calcium degradation test, calcium is first deposited on a first glass substrate via thermal evaporation. Typically, the calcium is deposited to a thickness of about 100 nm in a generally circular pattern having a diameter of about 1 inch. Then, the composition is disposed on the first glass substrate about the circumference of the calcium. A second glass substrate is then placed over the composition and the calcium, and the composition is cured to form the flexible barrier film 10, which effectively "seals" the calcium between the first and second glass substrates to form a test structure. The test structure is then placed in a temperature and humidity controlled oven, which operates at 22° C. and 47% relative humidity. As the calcium oxidizes, calcium oxide and hydrogen gas are formed. The calcium becomes transparent as the calcium oxidizes, and the transparency is measured via a Gardner Haze Meter, and the transparency is converted to the water vapor transmission rate.

As set forth above, the present invention also provides an organic electronic device 16. As set forth above, the organic electronic device 16 may be any organic electronic device 16 which includes the flexible barrier film 10 of the present invention. For example, the organic electronic device 16 may be the organic light emitting diode device, the organic electrochromic display device, the organic photovoltaic device, and/or the organic thin film transistor device.

The organic electronic device 16 comprises a support layer 22. The support layer 22 may comprise any material and may be transparent, translucent, or opaque. For example, in certain embodiments, the support layer 22 comprises a metal, such as stainless steel foil. In other embodiments, the support layer 22 comprises glass. Alternatively, the support layer 22 may comprise a polymeric material, such as polyethylene terephthalate, polyethersulfone, and/or polyethylene naphthalate. When the support layer 22 comprises the polymeric material, the support layer may further comprise the flexible barrier film 10 disposed thereon. In other words, the support layer 22 may be the same as the substrate 12, or may be the same as the substrate 12 having the flexible barrier film 10 disposed thereon. Because the flexible barrier film 10 of the present invention has excellent flexibility, it is advantageous when the support layer 22 is flexible as well. When the support layer 22 is flexible, the entire organic electronic device 16 is flexible without having adverse effects on the organic electronic device 16, such as breaking and/or cracking.

The organic electronic device 16 also comprises an organic electronic material 20 disposed on the support layer 22. The organic electronic material 20 is typically selected based on the type of organic electronic device 16. For example, when the organic electronic device 16 is the electrochromic device, the organic electronic material 20 typically comprises an electrochromic layer. Typically, the organic electronic material 20 comprises a polymer. In addition, the organic electronic material 20 typically further comprises a cathode and an anode, and the polymer is disposed between the cathode and the anode. Typically, the anode comprises indium tin oxide, which is substantially transparent. This is desirable because when the anode is transparent, a person can view the polymer of the organic electronic material 20, which typically displays a color and/or an image. The cathode typically comprises a metal film, such as a calcium film and/or an aluminum film. It is to be appreciated that depending on the type of organic electronic device 16, more layers may be present in the organic electronic material 20. For example, organic light emitting diode devices typically include an emissive layer and a conductive layer between the cathode and the anode. The type of organic electronic material 20 is not crucial for the purposes of the present invention.

The organic electronic device 16 further comprises an adhesive layer 18 disposed on the organic electronic material 20. The adhesive layer 18 may comprise any known adhesive; however, it is desirable that the adhesive layer 18 has the excellent water vapor transmission rates. The adhesive layer 18 may be the same as the flexible barrier film 10. In other words, the flexible barrier film 10 may be disposed directly over the organic electronic material 20 of the organic electronic device 16. In this embodiment, there is no need for an adhesive layer 18 in addition to the flexible barrier film 10. The flexible barrier film 10 of the present invention has excellent adhesion to a variety of substrates, including glass, metals, indium tin oxide, etc. One example of an adhesive layer suitable for the purposes of the present invention is the adhesive layer disclosed in co-pending U.S. patent application Ser. No. 13/144,395, which is entitled "adhesive flexible barrier film, method of forming same, and organic electronic device including same" and is/was filed on even day herewith.

Figure 3:
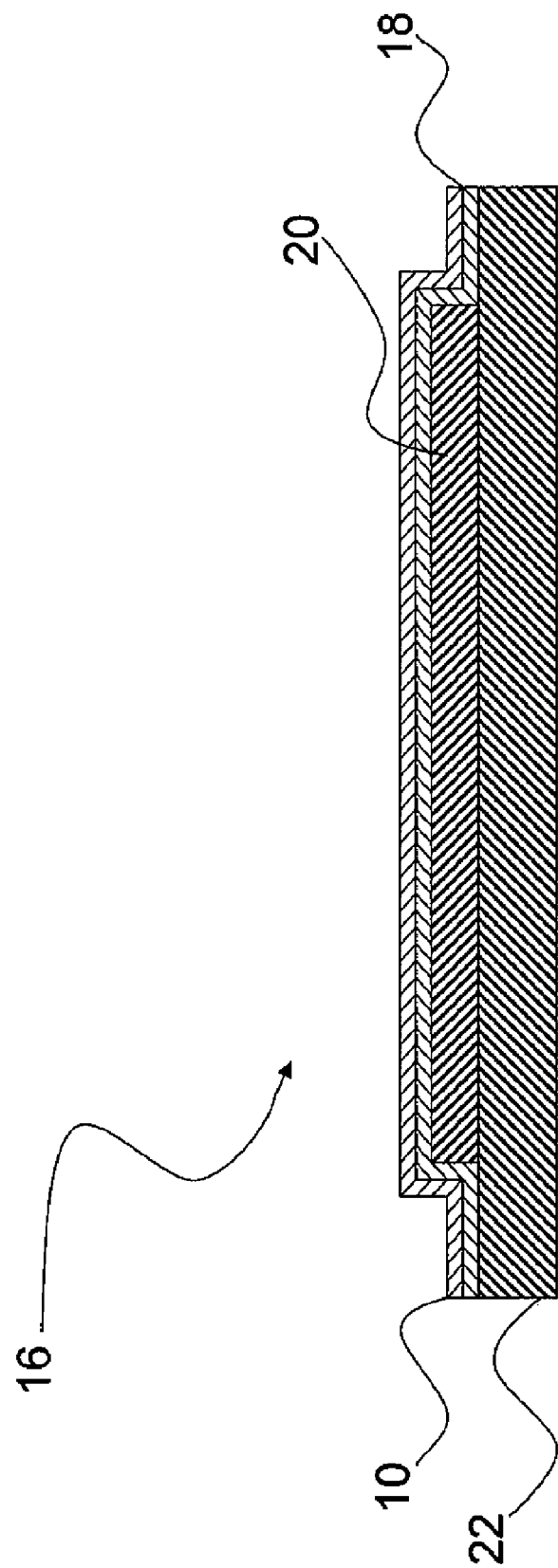
FIG. 3 is a schematic cross-sectional view of an organic electronic device comprising a support layer, an organic electronic material disposed on the support layer, an adhesive layer disposed on the organic electronic material, and the flexible barrier film disposed on the adhesive layer.
Figure 4:
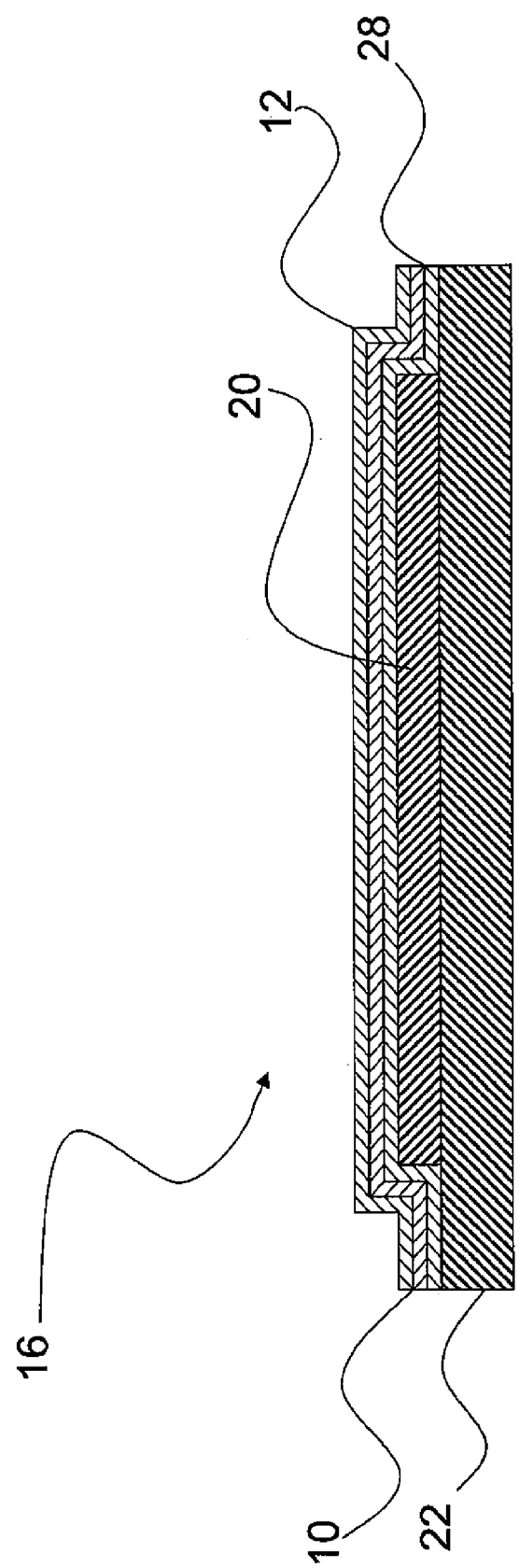
FIG. 4 is a schematic cross-sectional view of another organic electronic device comprising the support layer, the organic electronic material disposed on the support layer, the adhesive layer disposed on the organic electronic material, the flexible barrier film disposed on the adhesive layer, and the substrate disposed on the flexible barrier film.

The organic electronic device 16 also comprises the flexible barrier film 10 of the present invention, which is disposed over the adhesive layer 18 and the organic electronic material 20 such that the organic electronic material 20 is at least partially encapsulated by the support layer 22, the adhesive layer 18, and the flexible barrier film 10, as best shown in FIG. 3. As set forth above, the flexible barrier film 10 may have the inorganic layer 14 disposed thereon. In this embodiment, the inorganic layer 14 is disposed between the flexible barrier film 10 and the adhesive layer 18 and/or the organic electronic material 20. In addition, the flexible barrier film 10 may be disposed on the substrate 12. In this embodiment, as best shown in FIG. 4, the flexible barrier film 10 is typically disposed between the inorganic layer 14 and the substrate 12 such that the substrate 12 is the outermost layer of the organic electronic device 16. It is to be appreciated that the flexible barrier film 10 is typically cured once it is disposed on the adhesive layer 18 and/or the organic electronic material 20 of the organic electronic device 16. However, the flexible barrier film 10 may be cured prior to disposing the flexible barrier film 10 on the adhesive layer 18 and/or the organic electronic material 20 of the organic electronic device 16.

The organic electronic device 16 has excellent longevity and resistance to degradation due to the excellent water vapor transmission rates of the flexible barrier film 10. For example, the organic electronic device 16 typically has a useful life which exceeds 5,000 hours.

The following examples, illustrating the composition and the method of forming the flexible barrier film 10 of the present invention from the composition, are intended to illustrate and not to limit the invention.

EXAMPLES

Example 1

A composition comprises a multi-functional acrylate and the reaction product of an alkoxy-functional organometallic compound and an alkoxy-functional organosilicon compound. The reaction product is formed in the composition, i.e., the reaction product is not separately formed and subsequently added to the multi-functional acrylate to form the composition. To form the composition, a mixture is first formed. The amount and type of each component used to form the mixture is indicated in Table 1 below with all values in percent by weight based on the total weight of the combined components prior to reaction to make the mixture unless otherwise indicated.

TABLE 1

| | |
|---|---|
| Multi-functional acrylate 1 | 74.30% |
| Alkoxy-functional organometallic compound | 13.75% |
| Alkoxy-functional organosilicon compound 1 | 7.81% |
| Condensation catalyst | 4.13% |
| Autopolymerization inhibitor | 0.01% |

Multi-functional acrylate 1 is an aliphatic urethane diacrylate, commercially available from Cytec Industries, Inc. of West Paterson, N.J.

Alkoxy-functional organometallic compound is tetraethoxysilane, commercially available from Gelest, Inc. of Morrisville, Pa.

Alkoxy-functional organo silicon compound 1 is glycidoxypropyltrimethoxysilane, commercially available from Dow Corning Corp. of Midland, Mich.

Condensation catalyst is acetic acid, commercially available from many suppliers.

Autopolymerization inhibitor is phenothiazine, commercially available from many suppliers.

These components are disposed in a round-bottomed flask to form the mixture and the mixture is stirred via an air driven stirrer in a hood for 1 hour at room temperature. Then, water in an amount of 2.2 percent by weight based on the total weight of the components excluding the water is added to the mixture, thereby forming the composition. This amount of water is sufficient to ensure that the composition does not gel and a precipitate is not formed therefrom. This composition is mixed for one hour. The composition is then stripped via a rotary evaporator for 30 minutes at 60° C. A photoinitiating agent is then added to the composition in an amount of 2% by weight based on the total weight of the composition, which is commercially available from Sartomer_Co. of Exton, Pa.

To determine a water vapor transmission rate via a calcium degradation test, calcium is first deposited on a first glass substrate via thermal evaporation. The calcium is deposited to a thickness of about 100 nm in a generally circular pattern having a diameter of about 1 inch. Then, the composition is disposed on the first glass substrate about the circumference of the calcium. A second glass substrate is then placed over the composition and the calcium, and the composition is cured via ultraviolet radiation to form a flexible barrier film. This test structure is placed in a temperature and humidity controlled oven, which operates at 38° C. and 80% relative humidity. As the calcium oxidizes, calcium oxide and hydrogen gas are formed. The calcium becomes transparent as the calcium oxidizes, and the transparency is measured via a Gardner Haze Meter, and the transparency is converted to the water vapor transmission rate. The flexible barrier film formed from this composition had a water vapor transmission value of about $5 \times 10^{-5}$, which is excellent. In addition, the calcium had a useful life of greater than 5,000 hours, which is also excellent. Further, the flexible barrier film had excellent flexibility.

Example 2

A composition comprises a multi-functional acrylate and the reaction product of an alkoxy-functional organometallic compound and an alkoxy-functional organosilicon compound. The reaction product is formed in the composition, i.e., the reaction product is not separately formed and subsequently added to the multi-functional acrylate to form the composition. To form the composition, a mixture is first formed. The amount and type of each component used to form the mixture is indicated in Table 2 below with all values in percent by weight based on the total weight of the combined components prior to reaction to make the mixture unless otherwise indicated.

TABLE 2

| | |
|---|---|
| Multi-functional acrylate 2 | 74.30% |
| Alkoxy-functional organometallic compound | 13.75% |
| Alkoxy-functional organosilicon compound 2 | 7.81% |
| Condensation catalyst | 4.13% |
| Autopolymerization inhibitor | 0.01% |

Multi-functional acrylate 2 is a pentaerythritol tetraacrylate, commercially available from Sartomer Co. of Exton, Pa.

Alkoxy-functional organo silicon compound 2 is methacryloxypropyltrimethoxysilane, commercially available from Dow Corning Corp. of Midland, Mich.

These components are disposed in a round-bottomed flask to form the mixture and the mixture is stirred via an air driven stirrer in a hood for 1 hour at room temperature. Then, water in an amount of 2.2 percent by weight based on the total weight of the components excluding the water is added to the mixture, thereby forming the composition. This amount of water is sufficient to ensure that the composition does not gel and a precipitate is not formed therefrom. This composition is mixed for one hour. The composition is then stripped via a rotary evaporator for 30 minutes at 60° C. A photoinitiating agent is then added to the composition in an amount of 4% by weight based on the total weight of the composition, which is commercially available from Ciba Co. of Tarrytown, N.Y.

To determine a water vapor transmission rate via a calcium degradation test, calcium is first deposited on a first glass substrate via thermal evaporation. The calcium is deposited to a thickness of about 100 nm in a generally circular pattern having a diameter of about 1 inch. Then, the composition is disposed on the first glass substrate about the circumference of the calcium. A second glass substrate is then placed over the composition and the calcium, and the composition is cured via ultraviolet radiation to form a flexible barrier film. This test structure is placed in a temperature and humidity controlled oven, which operates at 38° C. and 80% relative humidity. As the calcium oxidizes, calcium oxide and hydrogen gas are formed. The calcium becomes transparent as the calcium oxidizes, and the transparency is measured via a Gardner Haze Meter, and the transparency is converted to the water vapor transmission rate. The flexible barrier film formed from this composition had a water vapor transmission value of about $8 \times 10^{-5}$, which is excellent. In addition, the calcium had a useful life of greater than 5,000 hours, which is also excellent. Further, the flexible barrier film had excellent flexibility.

Comparative Example 1

A composition comprises a multi-functional acrylate and the reaction product of an alkoxy-functional organometallic compound and an alkoxy-functional organosilicon compound. The reaction product is formed in the composition, i.e., the reaction product is not separately formed and subsequently added to the multi-functional acrylate to form the composition. To form the composition, a mixture is first formed. The amount and type of each component used to form the mixture is indicated in Table 3 below with all values in percent by weight based on the total weight of the combined components prior to reaction to make the mixture unless otherwise indicated.

TABLE 3

| | |
|---|---|
| Multi-functional acrylate 3 | 74.30% |
| Alkoxy-functional organometallic compound | 13.75% |
| Alkoxy-functional organosilicon compound 2 | 7.81% |
| Condensation catalyst | 4.13% |
| Autopolymerization inhibitor | 0.01% |

Multi-functional acrylate 3 is a butadiene functional acrylate oligomer, commercially available from Sartomer Co. of Exton, Pa.

These components are disposed in a round-bottomed flask to form the mixture and the mixture is stirred via an air driven stirrer in a hood for 1 hour at room temperature. Then, water in an amount of 2.2 percent by weight based on the total weight of the components excluding the water is added to the mixture, thereby forming the composition. This amount of water is sufficient to ensure that the composition does not gel and a precipitate is not formed therefrom. This composition is mixed for one hour. The composition is then stripped via a rotary evaporator for 30 minutes at 60° C. A photoinitiating agent is then added to the composition in an amount of 4% by weight based on the total weight of the composition, which is commercially available from Ciba Co. of Tarrytown, N.Y.

To determine a water vapor transmission rate via a calcium degradation test, calcium is first deposited on a first glass substrate via thermal evaporation. The calcium is deposited to a thickness of about 100 nm in a generally circular pattern having a diameter of about 1 inch. Then, the composition is disposed on the first glass substrate about the circumference of the calcium. A second glass substrate is then placed over the composition and the calcium, and the composition is cured via ultraviolet radiation to form a flexible barrier film. This test structure is placed in a temperature and humidity controlled oven, which operates at 38° C. and 80% relative humidity. As the calcium oxidizes, calcium oxide and hydrogen gas are formed. The calcium becomes transparent as the calcium oxidizes, and the transparency is measured via a Gardner Haze Meter, and the transparency is converted to the water vapor transmission rate. The flexible barrier film formed from this composition had a water vapor transmission value of about $1.5 \times 10^{-2}$, which is poor. In addition, the calcium had a useful life of fewer than 72 hours, which is also poor. However, the flexible barrier film formed from this composition had excellent flexibility.

As evidenced above, the type of multi-functional acrylate utilized in the composition has a direct impact on the physical properties of the flexible barrier film formed from the composition. For example, the flexible barrier film formed from the composition including the butadiene-functional acrylate had excellent flexibility, but had a poor water vapor transmission value and water vapor was able to permeate the flexible barrier film. In contrast, compositions comprising multi-functional acrylates selected from pentaerythritol tetraacrylate and aliphatic urethane diacrylate formed flexible barrier films having excellent water vapor transmission rates and excellent flexibilities.

The present invention has been described herein in an illustrative manner, and it is to be understood that the terminology which has been used is intended to be in the nature of words of description rather than of limitation. Obviously, many modifications and variations of the present invention are possible in light of the above teachings. The invention can be practiced otherwise than as specifically described within the scope of the appended claims.

What is claimed is:

1. A flexible barrier film having a thickness of from greater than zero to less than 2,000 nanometers and a water vapor transmission rate of no more than $1 \times 10^{-2}$ g/m²/day at 22° C. and 47% relative humidity, wherein said flexible barrier film is formed from a composition, which comprises:
    (A) a multi-functional acrylate; and
    (B) the reaction product of:
        (1) an alkoxy-functional organometallic compound having the general chemical formula $M(OR)_4$ wherein M is selected from a silicon atom, a zirconium atom and a titanium atom, and each OR is an independently selected alkoxy group; and (2) an alkoxy-functional organosilicon compound having the general chemical formula $X_a Si(OR^1)_b$ wherein each X is an independently selected monovalent organic radical; each $OR^1$ is an independently selected alkoxy group; a is 1, 2, or 3; b is 1, 2, or 3; and a+b=4; and (3) water in an amount sufficient to ensure said reaction product (B) does not gel and a precipitate does not form therefrom.

2. A flexible barrier film as set forth in claim 1 having a thickness of from greater than zero to less than 500 nanometers.

3. A flexible barrier film as set forth in claim 1 having a water vapor transmission rate of no more than $10^{-3}$ g/m²/day at 22° C. and 47% relative humidity.

4. A flexible barrier film as set forth in claim 1 wherein said multi-functional acrylate (A) of said composition is further defined as an aliphatic urethane acrylate.

5. A flexible barrier film as set forth in claim 1 wherein said reaction product (B) of said composition is formed in the presence of a siloxane polymerization catalyst selected from the group of sulfuric acid, perchloric acid, trifluoromethane sulfonic acid, acrylic acid, potassium hydroxide, sodium hydroxide, amines, and combinations thereof.

6. A flexible barrier film as set forth in claim 1 wherein said monovalent organic radical of said alkoxy-functional organosilicon compound (B)(2) comprises at least one ethylenically unsaturated group and is selected from the group of vinyl radicals, hexenyl radicals, methacryloxy radicals, acryloxy radicals, styryl radicals, vinyl ether radicals, and combinations thereof.

7. A flexible barrier film as set forth in claim 1 wherein said alkoxy-functional organometallic (B)(1) compound is further defined as tetraalkoxysilane.

8. A flexible barrier film as set forth in claim 1 wherein said alkoxy-functional organometallic compound (B)(1) is further defined as tetraalkyltitanate.

9. A flexible barrier film as set forth in claim 1 disposed on a substrate.

10. A flexible barrier film as set forth in claim 9 wherein said substrate is further defined as a polymeric substrate selected from the group of polyesters, polyethersulphones, polyimides, fluorocarbons, and combinations thereof.

11. A flexible barrier film as set forth in claim 1 further comprising an inorganic layer disposed on said flexible barrier film.

12. A method of forming the flexible barrier film according to claim 1 on a substrate, said method comprising the steps of disposing the composition on the substrate, and curing the composition to form the flexible barrier film on the substrate.

13. A method as set forth in claim 12 further comprising the step of disposing an inorganic composition on the flexible barrier film to form an inorganic layer on the flexible barrier film.

14. A method as set forth in claim 13 wherein the step of disposing the inorganic composition on the flexible barrier film comprises plasma chemical vapor depositing the inorganic composition on the flexible barrier film.

15. A method as set forth in claim 12 wherein the step of disposing the composition on the substrate comprises gravure rolling the composition on the substrate.

16. A method as set forth in claim 12 wherein the substrate is further defined as a polymeric substrate.

17. A method as set forth in claim 12 wherein the composition further comprises a photoinitiating agent and wherein the step of curing the composition to form the flexible barrier film on the substrate comprises applying ultraviolet radiation to the composition.

18. An organic electronic device, comprising:
a support layer;
an organic electronic material disposed on said support layer;
an adhesive layer disposed on said organic electronic material; and
a flexible barrier film disposed on said adhesive layer such that said organic electronic material is encapsulated by said support layer, said adhesive layer, and said flexible barrier film;
wherein said flexible barrier film has a thickness of from greater than zero to less than 5,000 nanometers and a water vapor transmission rate of no more than $1 \times 10^{-2}$ g/m²/day at 22° C. and 47% relative humidity, and wherein said flexible barrier film is formed from a composition, which comprises:
(A) a multi-functional acrylate; and
(B) the reaction product of:
  (1) an alkoxy-functional organometallic compound having the general chemical formula $M(OR)_4$ wherein M is selected from a silicon atom, a zirconium atom and a titanium atom, and each OR is an independently selected alkoxy group; and
  (2) an alkoxy-functional organosilicon compound having the general chemical formula $X_a Si(OR^1)_b$ wherein each X is an independently selected monovalent organic radical; each $OR^1$ is an independently selected alkoxy group; a is 1, 2, or 3; b is 1, 2, or 3; and a+b=4; and
  (3) water in an amount sufficient to ensure said reaction product (B) does not gel and a precipitate does not form therefrom.

19. An organic electronic device as set forth in claim 18 further comprising a substrate disposed on said flexible barrier film for supporting said flexible barrier film.

20. An organic electronic device as set forth in claim 19 wherein said substrate is further defined as a polymeric substrate selected from the group of polyesters, polyethersulphones, polyimides, fluorocarbons, and combinations thereof.

21. An organic electronic device as set forth in claim 18 further comprising an inorganic layer disposed between said adhesive layer and said flexible barrier film.

22. An organic electronic device as set forth in claim 18 further defined as one of an organic light emitting diode device, an organic photovoltaic device, and an organic electrochromic device.

* * * * *